(12) United States Patent
Chen et al.

(10) Patent No.: US 8,199,553 B2
(45) Date of Patent: Jun. 12, 2012

(54) MULTILEVEL FREQUENCY ADDRESSABLE FIELD DRIVEN MRAM

(75) Inventors: Wenyu Chen, San Jose, CA (US); Sylvia H. Florez Marino, San Jose, CA (US); Liesl Folks, Campbell, CA (US); Bruce D. Terris, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 277 days.

(21) Appl. No.: 12/640,081

(22) Filed: Dec. 17, 2009

(65) Prior Publication Data

US 2011/0149632 A1    Jun. 23, 2011

(51) Int. Cl.
G11C 11/00 (2006.01)

(52) U.S. Cl. ........ 365/130; 365/171; 365/173; 365/158; 365/189.01

(58) Field of Classification Search .......... 365/130, 365/171, 173, 158, 189.01
See application file for complete search history.

(56) References Cited

U.S. PATENT DOCUMENTS

| | | | |
|---|---|---|---|
| 6,351,409 B1 | 2/2002 | Rizzo et al. | |
| 6,603,677 B2* | 8/2003 | Redon et al. | 365/158 |
| 6,791,868 B2 | 9/2004 | Gider et al. | |
| 6,950,335 B2* | 9/2005 | Dieny et al. | 365/171 |
| 7,061,797 B1 | 6/2006 | Miltat et al. | |
| 7,224,601 B2* | 5/2007 | Panchula | 365/158 |
| 7,239,541 B2 | 7/2007 | Saito et al. | |
| 7,336,528 B2 | 2/2008 | Lim | |
| 7,443,718 B2* | 10/2008 | Ito et al. | 365/158 |
| 7,453,412 B2* | 11/2008 | Murali et al. | 343/787 |
| 7,471,491 B2 | 12/2008 | Sato et al. | |
| 7,502,248 B2 | 3/2009 | Lim | |
| 7,701,756 B2* | 4/2010 | Aouba et al. | 365/158 |
| 7,724,469 B2* | 5/2010 | Gao et al. | 360/125.3 |
| 7,738,287 B2* | 6/2010 | Diao et al. | 365/158 |
| 7,742,329 B2* | 6/2010 | Yoon et al. | 365/158 |
| 7,755,153 B2* | 7/2010 | Ho et al. | 257/421 |
| 7,800,938 B2* | 9/2010 | Rivkin et al. | 365/158 |

(Continued)

FOREIGN PATENT DOCUMENTS

JP    2007242092 A    9/2007

(Continued)

OTHER PUBLICATIONS

T. Moriyama et al., "Microwave-assisted magnetization switching of Ni80Fe20 in magnetic tunnel junctions," Applied Physics Letters 90, 152503 (2007), 3 pages.

(Continued)

Primary Examiner — Viet Q Nguyen

(57) ABSTRACT

A three-dimensional nonvolatile memory array device includes a plurality of memory elements and a memory controller. The plurality of memory elements each have a stack of a plurality of bits, which in turn each include a magnetic free layer, a magnetic pinned layer, and a non-magnetic layer. The magnetic free layer is configured to alternate its magnetization orientation based on a radio frequency current being at a resonant frequency of the magnetic free layer and on a magnetic field being applied to the magnetic free layer. The magnetic pinned layer has a specific magnetization orientation. The non-magnetic layer is located in between the magnetic free layer and the magnetic pinned layer. The memory controller is in communication with each of the plurality of memory elements, and configured to write data to and read data from the plurality of bits in the memory elements.

6 Claims, 5 Drawing Sheets

U.S. PATENT DOCUMENTS

| | | | | |
|---|---|---|---|---|
| 8,077,509 | B2 * | 12/2011 | Yanagi et al. | 365/173 |
| 8,085,582 | B2 * | 12/2011 | Nakamura et al. | 365/158 |
| 2007/0285978 | A1 | 12/2007 | Asatani | |
| 2008/0145951 | A1 | 6/2008 | Folks et al. | |
| 2009/0116310 | A1 | 5/2009 | Florez Marino et al. | |
| 2009/0168501 | A1 | 7/2009 | Ito | |

FOREIGN PATENT DOCUMENTS

| | | |
|---|---|---|
| JP | 2008305827 A | 12/2008 |

OTHER PUBLICATIONS

X. Zhu et al., "Spin Torque and Field-Driven Perpendicular MRAM Designs Scalable to Multi-Gb/Chip Capacity," IEEE Transactions on Magnetics, vol. 42, No. 10, Oct. 2006, pp. 2739-2741.

G. Finocchio et al., "Magnetization dynamics driven by the combined action of ac magnetic field and dc spin-polarized current," Journal of Applied Physics 99, 08G507 (2006), 3 pages.

* cited by examiner

MULTILEVEL FREQUENCY ADDRESSABLE FIELD DRIVEN MRAM

BACKGROUND OF THE INVENTION

1. Field of the Disclosure

The present invention relates in general to storage devices, and more particularly relates to a multilevel frequency addressable field driven MRAM.

2. Description of the Related Art

Two state magnetoresistive devices such as metallic spin valves and magnetic tunnel junctions consist of at least two magnetic layers separated by a nonmagnetic layer. The resistance of the device depends on the relative orientation of the magnetization in the two magnetic layers, such as a pinned layer and a free layer, and can be controlled through an external field or by passing a current perpendicularly through the device. This type of device has multiple applications among which magnetoresistive random access memory (MRAM) is included. Two mechanisms for switching the orientation of the magnetization of the free layer exist for MRAM, such as magnetic field switching and current switching. Magnetic field driven MRAM applications can including automotive uses such as data logging, configuration storage, crash recorders, sensors, and airbags, consumer uses such as portable multimedia, gaming machines, and mobile phones, encryption for security systems, RAD hard military, space, radio frequency identification (RFID), networking, and server applications.

SUMMARY

Embodiments of a system, method, and apparatus for controlling a multilevel frequency addressable field driven MRAM are disclosed. The multilevel frequency addressable field driven MRAM includes a plurality of memory elements and a memory controller. The plurality of memory elements each have a stack of a plurality of bits, which in turn each include a magnetic free layer, a magnetic pinned layer, and a non-magnetic layer. The magnetization of each free layer has two possible states that can be set with a combination of an applied magnetic field and an alternating current with frequency corresponding to its resonant frequency. The alternating current has the effect of reducing the threshold magnetic field level to induce a bit reversal of the magnetic free layer. The magnetic pinned layer has a specific magnetization orientation. The non-magnetic layer is located in between the magnetic free layer and the magnetic pinned layer to decouple the magnetization of the magnetic pinned layer from the magnetization of the magnetic free layer. The memory controller is in communication with each of the plurality of memory elements, and configured to write data to and read data from the plurality of bits in the memory elements.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE INVENTION

Figure 1:
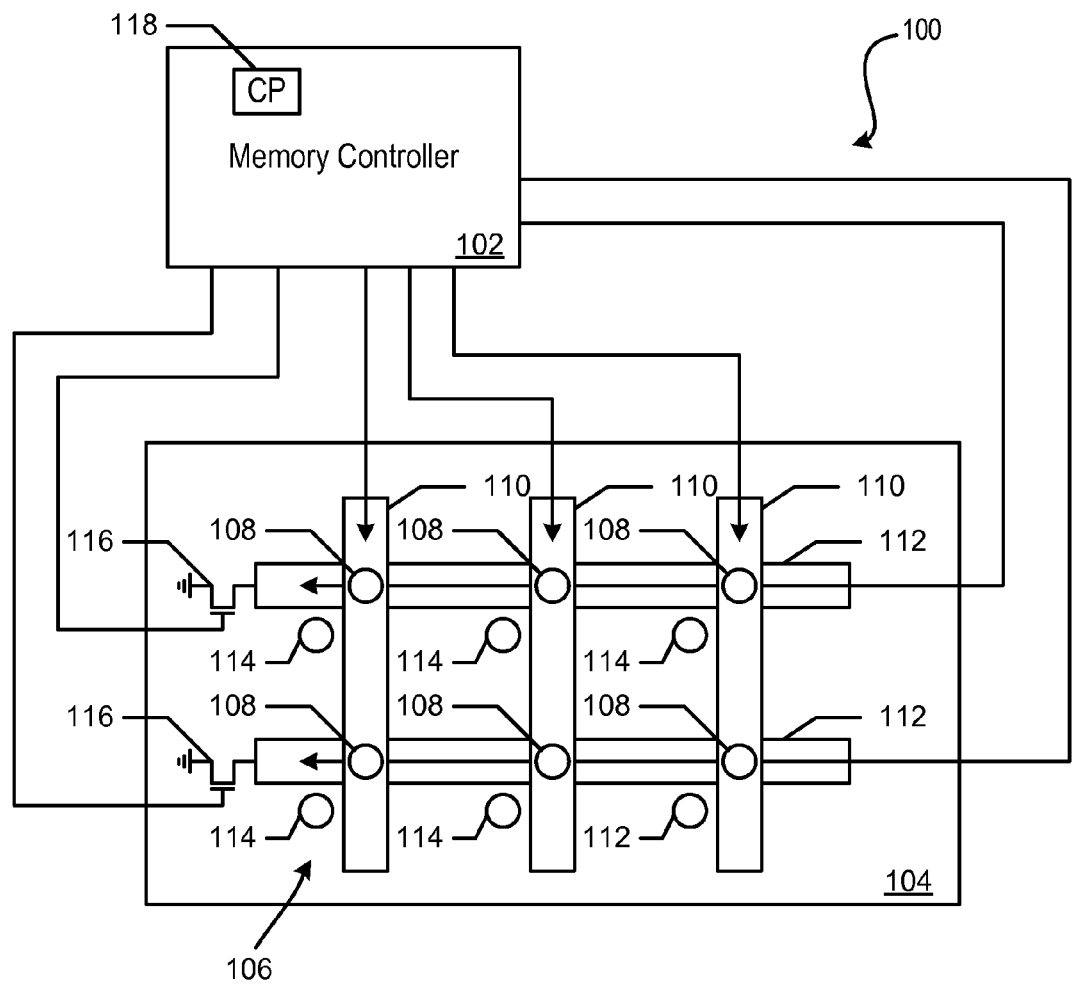
FIG. 1 is partial block diagram and partial schematic diagram of a memory device.

FIG. 1 shows a memory system 100 including a memory controller 102 and a memory 104, which in turn includes a memory array 106. The memory array 106 includes a plurality of memory elements 108, a plurality of radio frequency (RF) lines 110, a plurality of selector lines 112, a plurality of current lines 114, and a plurality of isolation transistors 116. The memory controller 102 can also include a computer program 116 including instructions for the memory controller, such as instructions for writing data and/or reading data from the memory array 106. The memory controller 102 can be any type of processing unit, such as a microprocessor. The memory controller 102 is in communication with the plurality of memory elements 108, the plurality of radio frequency lines 110, the plurality of selector lines 112, the plurality of current lines 114, and the plurality of isolation transistors 116 of the memory array 106.

The memory elements 108 of the memory array 106 are preferably field driven memory elements, such that the memory array can be a multilevel magnetoresistive random access memory (MRAM). The memory array 106 can be a nonvolatile memory. Thus, the memory element 108 can include a stack of multiple bits, which can be set based on a magnetic field generated by a direct current (DC) passing through the current line 114 near the memory element. Additionally, the memory element 108 can be selected for either a read or a write operation in response to the isolation transistor 116 connected to the selector line 112 of the memory element being activated and DC current being drawn through the memory element. An RF current can be provided on the RF line 110 associated with the memory element 108 to further control the writing of a bit within the memory element as discussed in detail below with respect to FIG. 2. During operation, the memory controller 102 can provide different direct currents, RF currents, voltages, and the like to the components of the memory array 106 to control the reading and writing of data in the memory array.

Figure 2:
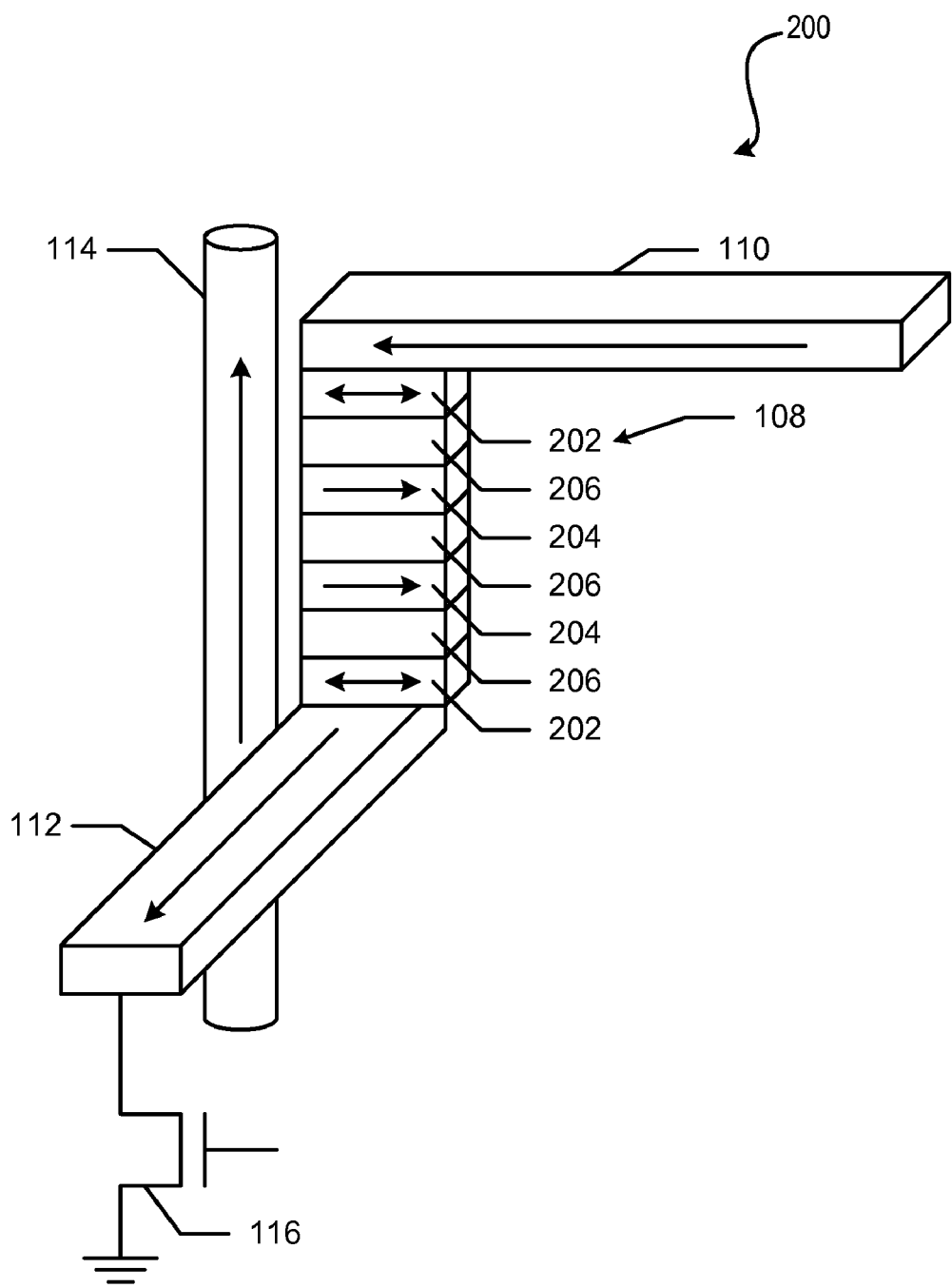
FIGS. 2 and 3 are schematic diagrams of a portion of a multilevel memory array.

FIG. 2 shows a portion 200 of the memory array 106 including the memory element 108, the RF line 110, the selector line 112, the current line 114, and the isolation transistor 116. The memory element 108 includes a plurality of magnetic layers, such as free layers 202 and pinned layers 204, and non-magnetic layers 206. As stated above, the memory array 106 can be multilevel such that each memory element 108 or cell can include multiple bits stacked together to form the memory element. Thus, the multilevel memory array 106 can have higher areal bit densities than other memory arrays. Each bit of the memory element 108 includes a magnetic free layer 202, a magnetic pinned layer 204, and a non-magnetic layer 206 located in between the free layer and the pinned layer. Additionally, another non-magnetic layer 206 can be located in between each of the bits in the memory element 108.

Figure 3:
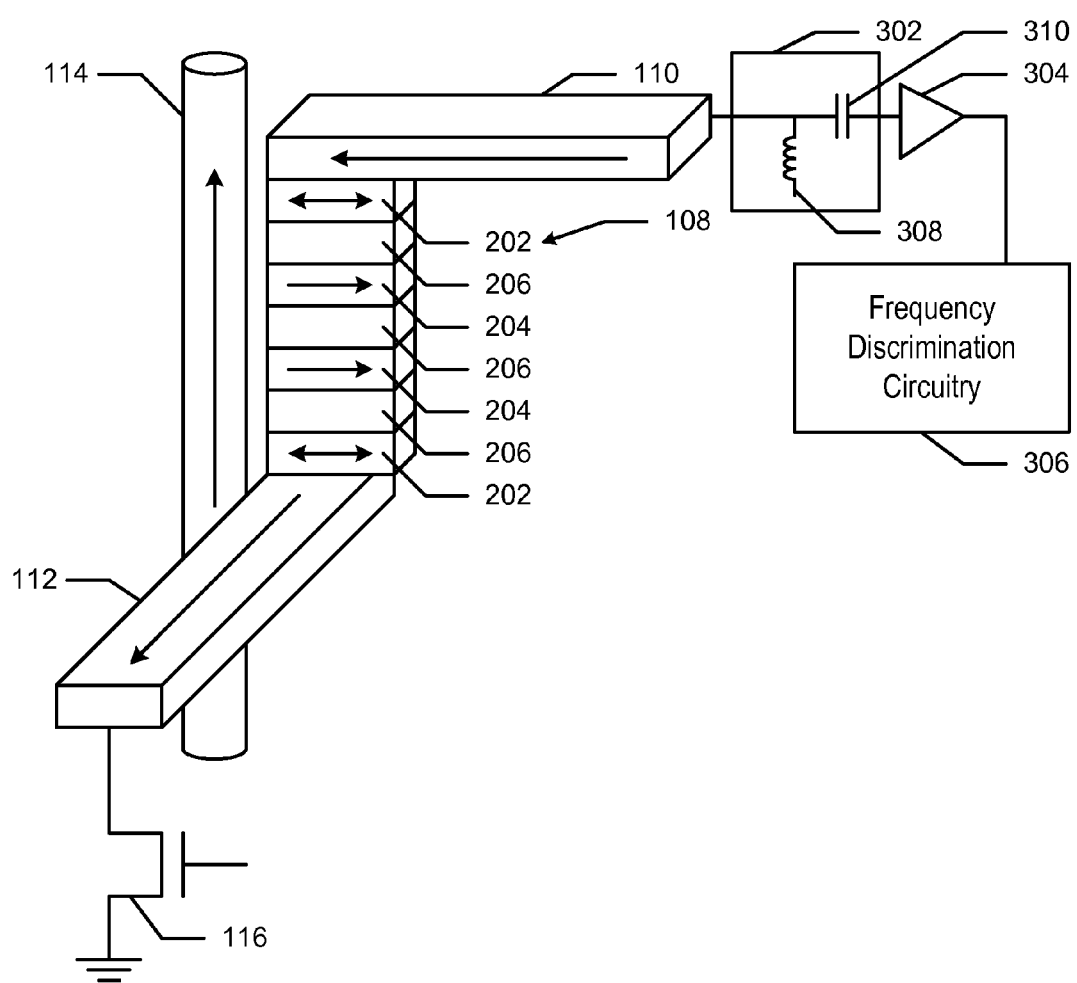

In the embodiment of the memory element 108 shown in FIGS. 2 and 3, the memory element includes two bits such that a free layer 202 of the first bit is in communication with the RF line 110, and a non-magnetic layer 206 is in communication with both the free layer and a pinned layer 204 to form the first bit of the memory element 108. The free layer 202 of a second bit is in communication with the selector line 112, and a non-magnetic layer 206 is in communication with both the free layer and a pinned layer 204 to form the second bit of the memory element 108. The two bits of the memory element 108 can have a non-magnetic layer between the pinned layers 204 of the bits.

The magnetization direction in the free layer 202 can have two possible orientations that can be set by a combination of an external magnetic field and a current. However, the pinned layer 204 is preferably configured with a single magnetization orientation that can be used as a reference magnetic field when data is read from the memory element 108. The orientation of the magnetization of the free layer 202 in relation to the orientation of the magnetization of the pinned layer 204 can determine whether the associated bit is written as a logic '1' or '0'. For example, if the magnetic field of the free layer 202 is parallel with the magnetic field of the pinned layer 204, the bit can be read as logical '0'. Alternatively, if the magnetic field of the free layer 202 is anti-parallel with the magnetic field of the pinned layer 204, the bit can be read as logical '1'.

During a write phase, the memory controller 102 can provide a voltage to and can activate the isolation transistor 116 associated with the memory element 108 that the memory controller is attempting to write. Then the memory controller 102 can provide a DC current through the selector line 112 and the isolation transistor 116 to activate the memory element 108. The memory controller 102 can then provide a low level DC current through the current line or magnetic field generating line 114 near the memory element 108. The low level DC current can generate a low level magnetic field in a direction of a desired bit reversal in the memory element 108. Thus, a desired direction of the low level DC current can be determined based on a direction of the desired bit reversal of a bit in the memory element 108. For example, if the low level DC current is applied in one direction, the low level magnetic field can be generated in one direction. Alternatively, if the low level DC current is applied in the other direction, the low level magnetic field can be generated in the opposite direction.

The low level magnetic field generated is preferably below a threshold level to trigger a bit reversal of the free layers 202 in the bits of the memory element 108. Thus, the low level magnetic field does not cause the reversal of every free layer 202 in the memory element 108. The memory controller 102 can further select a desired free layer 202 by injecting a RF current into the memory element 108 through the RF line 110 at the resonant frequency of the desired free layer of the bit to write. The corresponding resonant frequency of a given free layer 202 can be controlled via shape, thickness, material selection, and the like of the free layer. Thus, each free layer 202 in a multi-level memory element 108 can have a different resonant frequency based on the physical design of the free layer. When the RF current is injected into the memory element 108 at the resonant frequency of the desired free layer 202, the magnetic field required for the bit reversal of the desired free layer is significantly reduced. Thus, the memory element 108 can have multiple bits with different resonant frequency. In the presence of the low reversal magnetic field generated by the current line 114, only the bit with the resonant frequency substantially equal to the frequency of the RF current will be written to. The RF current causes a reduction in the magnetic field requirements, reduces crosstalk during the writing of a particular bit, and thereby enhances selectivity of bits.

In another embodiment, the isolation transistor 116 can be excluded from the memory array 106. In this embodiment, the memory controller 102 can inject a RF current into each of the memory elements 108 of the memory array 106 through the RF lines 110 at the resonant frequency of a desired free layer of the bit to write. The memory controller 102 can then select the desired free layer by providing a low level DC current through the current line 114 near the memory element 108 of the desired free layer. The low level DC current can generate a low level magnetic field in a direction of a desired bit reversal in the selected memory element 108. Thus, injecting the RF current at the resonant frequency of the desired free layer through the RF lines 110 and injecting the DC current through the current line 114 near the desired free layer can cause a desired bit to be written.

FIG. 3 shows a portion 300 of the memory array 106 including the memory element 108, the RF line 110, the selector line 112, the current line 114, the isolation transistor 116, a filter circuit 302, an amplifier 304, and a frequency discrimination circuitry 306. The memory element 108 includes a plurality of magnetic layers, such as free layers 202 and pinned layers 204, and non-magnetic layers 206. The filter circuit 302 includes an inductor 308 and a capacitor 310. The RF line 110 is in communication with the filter circuit 302, which in turn is in communication with the amplifier 304. The amplifier 304 is in communication with the frequency discrimination circuit 306.

During a read operation, a DC current is provided to the memory element 108 from the memory controller 102 via the selector line 112 and the isolation transistor 116. The DC current is preferably a low level that is sufficient to excite the free layers 202 of the bits without causing a bit reversal of the free layers. When the low level DC current is applied to the memory element 108, each of the bits in the memory element 108 can produce a RF current having a frequency based in part on the respective resonant frequency of the free layer 202 of each bit. Additionally, the orientation of the magnetization of the free layer 202 in relation to the orientation of the magnetization of the pinned layer 204 can also affect the frequency of the RF current produce by the bit. Thus, depending on whether the orientations of the magnetizations of the free layer 202 and the pinned layer 204 are parallel or anti-parallel, the RF current produced when the memory element 108 has the low level DC current applied can be either slightly higher than the resonant frequency of the free layer or slightly lower than the resonant frequency of the free layer.

The low level DC current and a plurality of RF currents are provided along the RF line 110 toward the filter circuit 302. The inductor 308 and the capacitor 310 of the filter circuit 302 filter out the low level DC current and pass the RF currents to the amplifier 304. The amplified RF currents are then provided to the frequency discrimination circuitry 306. The frequency discrimination circuitry 306 can include the logic to compare the frequencies of the RF currents from the memory element 108 to reference frequencies to determine whether the orientation of the magnetizations in each free layer 202 and pinned layer 204 of the bits are parallel or anti-parallel. The frequency discrimination circuitry 306 can be pre-loaded with the reference frequencies for each of the bits in the memory array 106, such that the frequency discrimination circuitry can determine the state of the bits in the memory element 108 based on the frequencies of the RF currents produced by the bits. Thus, the frequency discrimination circuitry 306 can determine whether each bit is a logical '1' or a logical '0' based on the frequency of the RF current produced by the orientation of the magnetic field of the free layer 202 in relation to the orientation of the magnetization of the pinned layer 204.

In another embodiment, the isolation transistor 116 can be excluded from the memory array 106. In this embodiment, the DC current can be passed through each of the memory elements 110 of the memory array 106 to complete the read operation. The memory controller 102 can provide the DC current to the memory elements 110 via the selector lines 112. The DC current is preferably a low level that is sufficient to excite the free layers 202 of the bits without causing a bit reversal of the free layers. When the low level DC current is applied to each of the memory elements 108, each of the bits in the memory elements 108 can produce a RF current having a frequency based in part on the respective resonant frequency of the free layer 202 of each bit. As stated above, the frequency discrimination circuitry 306 can determine whether the orientation of the magnetizations in each free layer 202 and pinned layer 204 of the bits are parallel or anti-parallel. Additionally, in another the embodiment of the memory system 100, the current lines 114 can be utilized during the read operation to provide an applied magnetic field to further excite the desired bits of the memory element 108 near the current line. In another embodiment, the read operation can be performed without the use of the memory controller 102 utilizing the current lines 114 to provide the applied magnetic field to the memory element 108.

Figure 4:
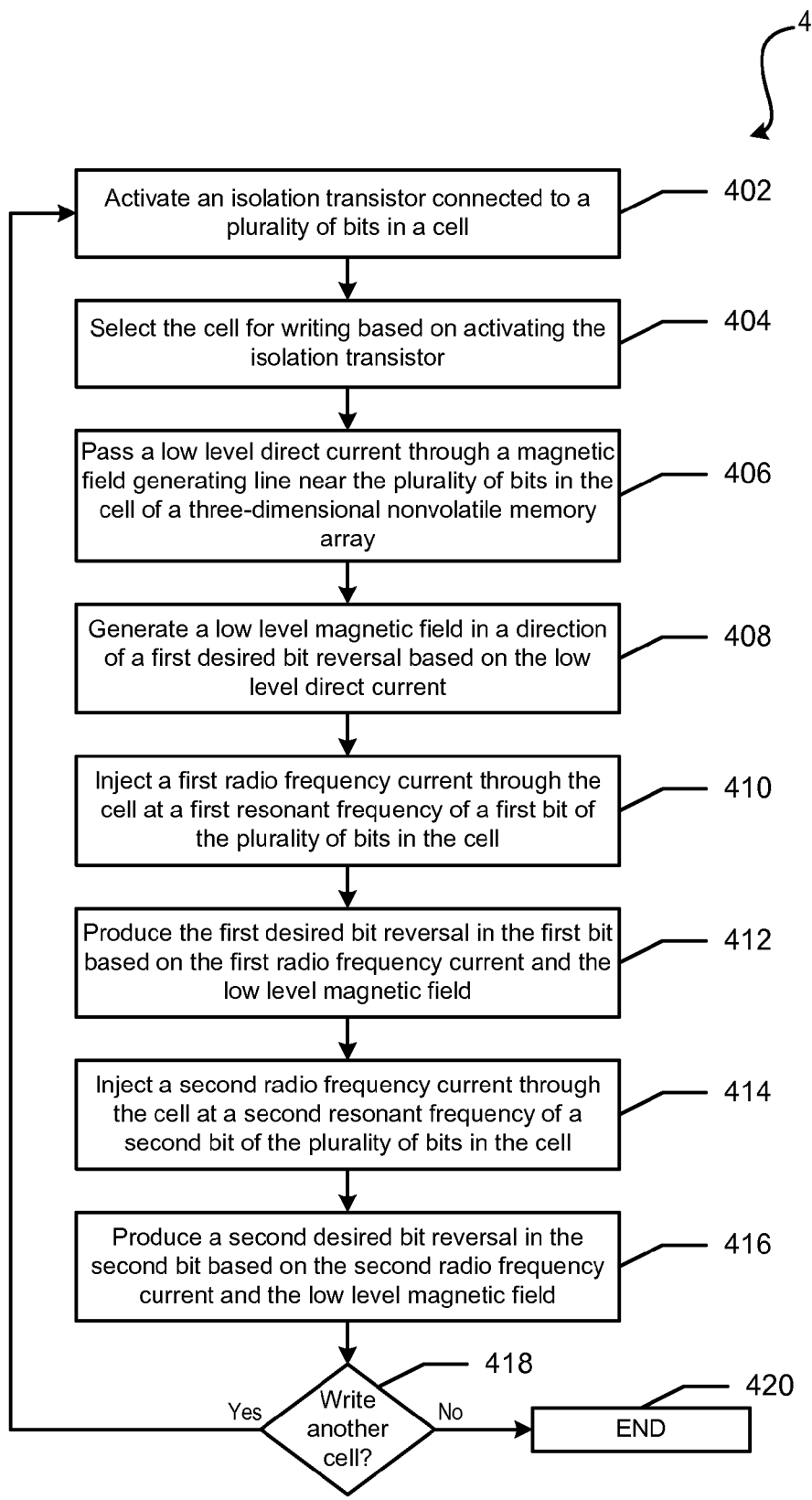
FIG. 4 is a flow diagram of a method for writing data to the multilevel memory array.

FIG. 4 shows a flow diagram of a method 400 for writing data to the multilevel memory array 106. At block 402, an isolation transistor connected to a plurality of bits in a cell is activated. The cell is selected for writing based on activating the isolation transistor at block 404. At block 406, a low level DC current is passed through a magnetic field generating line near the plurality of bits in the cell of the multilevel memory array. The multilevel memory array can be a three-dimensional nonvolatile memory array. A low level magnetic field is generated in a direction of a first desired bit reversal based on the low level direct current at block 408. The low level magnetic field can be below a required magnetic field level for the first desired bit reversal.

At block 410, a first radio frequency current is injected through the cell at a first resonant frequency of a first bit of the plurality of bits in the cell. The first radio frequency current preferably reduces the required magnetic field level for the first desired bit reversal in the first bit. The first desired bit reversal is produced based on the first radio frequency current, the low level magnetic field, and the reduction of the required magnetic field level for the first desired bit reversal at block 412. At block 414, a second radio frequency current is injected through the cell at a second resonant frequency of a second bit of the plurality of bits in the cell. The second radio frequency current preferably reduces the required magnetic field level for the second desired bit reversal in the second bit. At block 416, the second desired bit reversal is produced in the second bit based on the second radio frequency current, the low level magnetic field, and the reduction of the required magnetic field level for the second desired bit reversal in the second bit. At block 418, a determination is made whether another bit in another cell is to be written. If another bit in another cell is to be written the flow diagram continues as stated above at block 402, otherwise the flow diagram ends at block 420.

Figure 5:
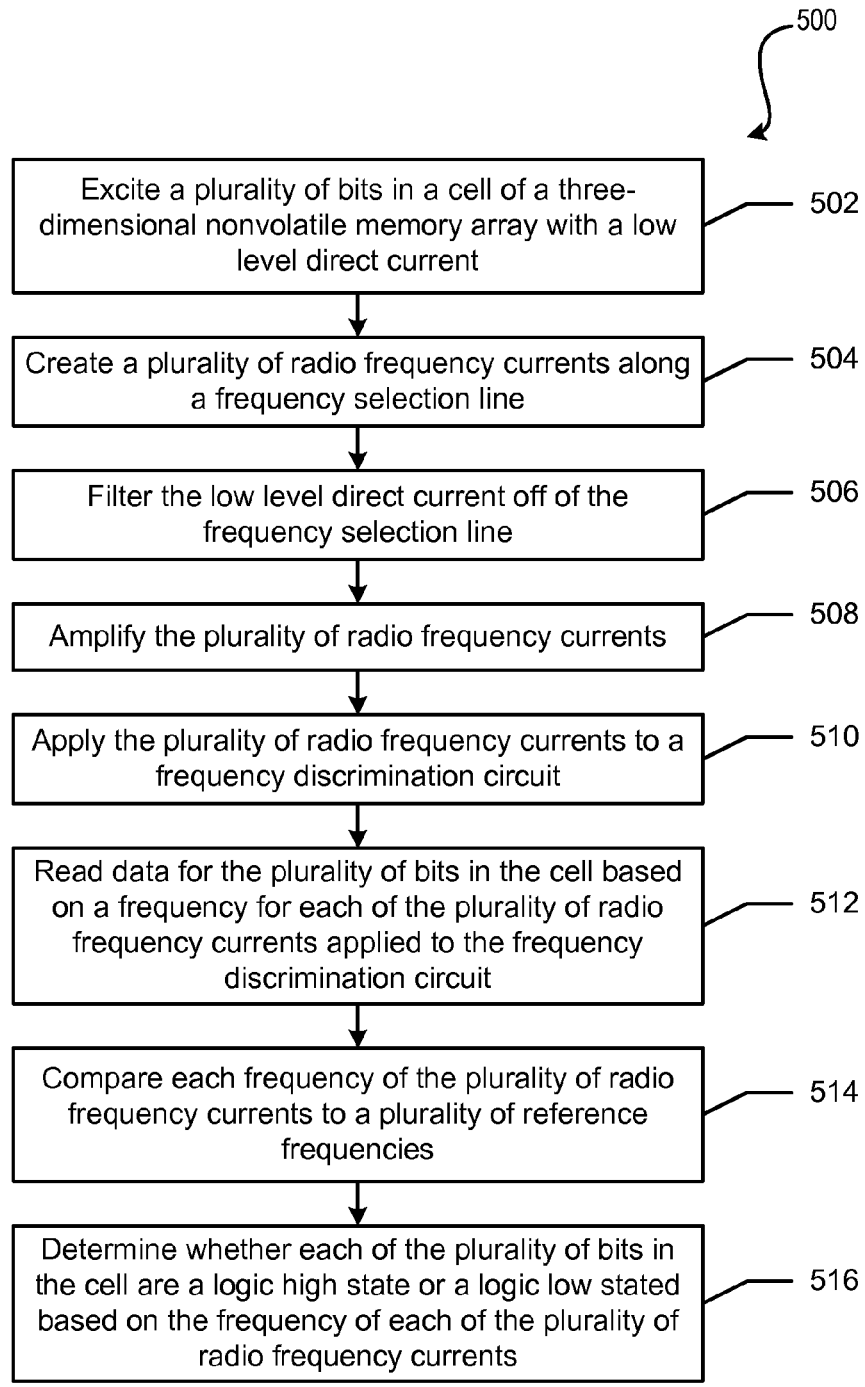
FIG. 5 is a flow diagram of a method for reading data from the multilevel memory array.

FIG. 5 shows a flow diagram of a method 500 for reading data from the multilevel memory array 106. At block 502, a plurality of bits in a cell of the multilevel memory array is excited with a low level direct current. The multilevel memory array can be a three-dimensional nonvolatile memory array. A plurality of radio frequency currents is created along a frequency selection line at block 504. At block 506, the low level direct current is filtered off of the frequency selection line. The plurality of radio frequency currents is amplified at block 508.

At block 510, the plurality of radio frequency currents is applied to a frequency discrimination circuit. Data for the plurality of bits in the cell are read based on a frequency for each of the plurality of radio frequency currents applied to the frequency discrimination circuit at block 512. At block 514, each frequency of the plurality of radio frequency currents is compared to a plurality of reference frequencies. A determination is made whether each of the plurality of bits in the cell are a logic high state or a logic low stated based on the frequency of each of the plurality of radio frequency currents at block 516.

This written description uses examples to disclose the disclosure, including the best mode, and also to enable those of ordinary skill in the art to make and use the disclosure. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. While the disclosure has been shown or described in only some of its forms, it should be apparent to those skilled in the art that it is not so limited, but is susceptible to various changes without departing from the scope of the disclosure.

What is claimed is:

1. A method of writing data in a three-dimensional nonvolatile memory array, the method comprising:
    passing a low level direct current through a first magnetic field generating line near a plurality of bits in a first cell of the three-dimensional nonvolatile memory array;
    generating a low level magnetic field in a direction of a first desired bit reversal based on the low level direct current, wherein the low level magnetic field is below a required magnetic field level for the first desired bit reversal;
    injecting a first radio frequency current through the first cell at a first resonant frequency of a first bit of the plurality of bits in the first cell to reduce the required magnetic field level for the first desired bit reversal in the first bit; and
    producing the first desired bit reversal in the first bit based on the first radio frequency current, the low level magnetic field, and the reduction of the required magnetic field level for the first desired bit reversal in the second bit.

2. The method of claim 1 further comprising:
    activating an isolation transistor connected to the plurality of bits in the first cell; and
    selecting the first cell for writing based on activating the isolation transistor.

3. The method of claim 1 wherein each free layer of the plurality of bits in the first cell has a different resonant frequency.

4. The method of claim 1 further comprising:
    injecting a second radio frequency current through the first cell at a second resonant frequency of a second bit of the plurality of bits in the first cell to reduce the required magnetic field level for the second desired bit reversal in the second bit; and
    producing a second desired bit reversal in the second bit based on the second radio frequency current, the low level magnetic field, and the reduction of the required magnetic field level for the second desired bit reversal in the second bit.

5. The method of claim 4 wherein low level magnetic field is below the required magnetic field level for the second desired bit reversal.

6. The method of claim 1 further comprising:

passing the low level direct current through a second magnetic field generating line near a second plurality of bits in a second cell of the three-dimensional nonvolatile memory array;

generating the low level magnetic field in the direction of a second desired bit reversal based on the low level direct current, wherein the low level magnetic field is below the required magnetic field level for the second desired bit reversal;

injecting the first radio frequency current through the second cell at the first resonant frequency of one of the second plurality of bits in the second cell; and producing the second desired bit reversal in the one of the second plurality of bits based on the second radio frequency current and the low level magnetic field.

\* \* \* \* \*